(12) United States Patent
Nagano

(10) Patent No.: US 7,024,077 B2
(45) Date of Patent: Apr. 4, 2006

(54) METHOD OF AND STRUCTURE FOR FIXING OPTICAL ELEMENT

(75) Inventor: Kazuhiko Nagano, Kanagawa-ken (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/830,447

(22) Filed: Apr. 23, 2004

(65) Prior Publication Data

US 2004/0264862 A1 Dec. 30, 2004

(30) Foreign Application Priority Data

Apr. 25, 2003 (JP) ............................. 2003-120992

(51) Int. Cl.
G02B 6/26 (2006.01)

(52) U.S. Cl. ............................. 385/39; 385/31; 385/88

(58) Field of Classification Search ................. 385/39, 385/31, 33, 49
See application file for complete search history.

(56) References Cited

U.S. PATENT DOCUMENTS

| | | | | | |
|---|---|---|---|---|---|
| 4,875,750 | A | * | 10/1989 | Spaeth et al. ................. | 385/35 |
| 5,513,201 | A | * | 4/1996 | Yamaguchi et al. .......... | 372/75 |
| 5,617,492 | A | * | 4/1997 | Beach et al. .................. | 385/33 |
| 5,854,867 | A | * | 12/1998 | Lee et al. ..................... | 385/49 |
| 5,909,524 | A | * | 6/1999 | Tabuchi ....................... | 385/49 |
| 6,718,088 | B1 | | 4/2004 | Okazaki et al. | |
| 2002/0131700 | A1 | * | 9/2002 | Nakama et al. ............... | 385/33 |

* cited by examiner

*Primary Examiner*—Sung Pak
(74) *Attorney, Agent, or Firm*—Sughrue Mion, PLLC

(57) ABSTRACT

An optical element is fixed to a flat fixing surface of a mount. A recess is formed in the fixing surface or a lower surface of the optical element to be brought into contact with the fixing surface and solid-state cementing material is placed in the recess. The optical element is disposed so that its lower surface is in contact with the fixing surface, and the cementing material is once fused and solidified so that the optical element is fixed to the mount by way of the cementing material with the lower surface kept in contact with the fixing surface of the mount.

12 Claims, 9 Drawing Sheets

METHOD OF AND STRUCTURE FOR FIXING OPTICAL ELEMENT

BACKGROUND OF THE INVENTION

1. Field of the Invention

This invention relates to a method of and a structure for fixing an optical element on a mount.

2. Description of the Related Art

There have been put into practice, as a system for generating a laser beam in an ultraviolet region, a wavelength-conversion laser which converts an infrared beam radiated from a semiconductor-laser-excited solid state laser into its third harmonic in a ultraviolet region, an excimer laser, and an Ar-laser.

Recently, there have been provided GaN series semiconductor lasers (laser diodes) which generate a laser beam of a wavelength close to 400 nm as disclosed in "Japanese Applied Physics Letters, vol. 37 (1998), p.L1020".

Light sources generating a laser beam in such a wavelength range can be employed as an exposure light source in an exposure system for exposing a photosensitive material which is sensitive to light in a predetermined wavelength range including an ultraviolet region of 350 to 420 nm (will be referred to as "the ultraviolet region", hereinbelow). In this case, the exposure light source is, naturally, required to have an output power sufficient to sensitize the photosensitive material.

However, the excimer laser is disadvantageous in that the system is too large in size and too high in cost and maintenance cost.

Further, when the wavelength-conversion laser which converts an infrared beam into its third harmonic in a ultraviolet region is employed, it is very difficult to obtain a high output power due to very low wavelength conversion efficiency of the wavelength-conversion laser. At present, the practical level is on a level such that a fundamental wave (1064 nm) at 10 W is oscillated by a laser diode at 30 W and converted to its second harmonic (532 nm) at 3 W and a third harmonic (355 nm) which is at a frequency equal to the sum frequency of the fundamental wave and its second harmonic is obtained at 1 W. The electro-optic efficiency of the laser diode is about 50% and the conversion efficiency to an ultraviolet beam is as very low as 1.7%. Further since employing an expensive wavelength conversion element, such a wavelength-conversion laser is substantially high in cost.

Further, the Ar-laser is very low as 0.005% in electro-optic efficiency and is very short as about 1000 hours in service life.

Further, in the GaN series laser diodes, since a GaN crystal substrate of a low dislocation cannot be obtained, attempts of obtaining a high output power and a high reliability have been made by forming a low dislocation region of about 5 μm by a method of growth generally called ELOG and forming a laser region on the low dislocation region. However, even in GaN series laser diodes produced in such a manner, those that are as high as 500 mW to 1 W in output power have not been commercialized due to a difficulty of making a substrate of low dislocation.

As another attempt of increasing the output power of the laser diode, there can be conceived a method involving obtaining, for instance, a laser beam at 10 W by forming one hundred cavities each outputs a laser beam at 100 mW. However, it is almost not practical to make as many as one hundred cavities at a high yield. It is especially true of GaN series laser diodes where it is difficult to raise the yield to 99% or higher even the diodes have only a single cavity.

In view of the foregoing observations, this applicant has proposed a laser system which can generate a laser beam at an especially high output power. (U.S. Pat. No. 6,718,088: will be simply referred to as "patent publication 1", hereinbelow) The laser system disclosed in patent publication 1 comprises a plurality of laser diodes, a single multi-mode optical fiber, and a collective optical system which collects laser beams radiated from the laser diodes and couples the collected laser beams to the multi-mode optical fiber. In one preferred embodiment of the laser system, the laser diodes are disposed so that their light emitting points are arranged in one direction.

In patent publication 1, there is also disclosed a multi-cavity laser diode having a plurality of light emitting points. One or more such multi-cavity laser diodes can be used in place of the laser diodes in the laser system disclosed in patent publication 1.

In the laser system where a plurality of laser beams are synthesized together, the laser diodes are generally fixed to a block such as a heat radiating block of Cu, Cu alloy or AlN.

Since the laser beam is radiated from each light emitting point of a laser diode having one or more light emitting points in the form of divergent light, it is necessary to first pass each of the laser beams through a collimator lens and then pass the collimated laser beams through a collective lens in order to converge the laser beams on one point. Though the collimator lenses may be disposed separately from each other, the laser system can be small in size and can be easily adjusted when the collimator lenses are integrated into a collimator lens array in which a plurality of collimator lenses are arranged in a line.

When a collimator lens array is employed, each collimator lens of the array must be positioned so that its optical axis is accurately aligned with the light emitting axis of the corresponding laser diode. Otherwise, a plurality of laser beams cannot be converged in a small spot, and accordingly, for instance, it becomes unfeasible to finely imagewise expose the above described photosensitive material with the laser beams.

The laser diodes and/or the collimator lens array are generally fixed to a flat mount by solder. Conventionally, the laser diode or the collimator lens array is fixed in place by positioning the laser diode or the collimator lens array on molten solder which has been melt on the mount and solidifying the molten solder. In Japanese Patent Application 2002-287640 filed by this applicant, an improved example of such a fixing method is disclosed.

However, such a method of fixing an optical element gives rise to a problem that it is difficult to stably hold the optical element such as the laser diode or the collimator lens array on the solder the state of which changes while it is solidified and the optical element can be slightly shifted from the correct position when the solder is solidified. In this case, accuracy of positioning the laser diode and the collimator lens array with respect to each other deteriorates. For example, it becomes difficult to secure a positioning accuracy of 0.5 μm. If the accuracy of positioning the laser diode and the collimator lens array with respect to each other deteriorates, more laser beams impinge upon the corresponding collimator lenses in the collimator lens array with their optical axes out of alignment with the optical axes of the corresponding collimator lenses as the number of the laser beams to be synthesized is increased, whereby it becomes difficult to obtain a high intensity synthesized laser beam.

Though a problem caused in positioning and fixing a laser diode and a collimator lens array has been described by way of example, there has been a wide demand that optical elements other than the laser diode or the collimator lens array should be accurately positioned and fixed when the optical elements are to be fixed on a flat mount by cement such as solder.

SUMMARY OF THE INVENTION

In view of the foregoing observations and description, the primary object of the present invention is to provide a method of and a structure for fixing an optical element to a flat fixing surface of a mount holding a high accuracy in positioning.

Another object of the present invention is to provide a method of and a structure for fixing the collimator lens array and/or the laser diodes to a flat fixing surface of a mount holding a high accuracy in positioning in a laser system where a plurality of laser beams are synthesized into a single laser beam by the use of an optical fiber.

In accordance with the present invention, there is provided a first optical element fixing method for fixing an optical element to a flat fixing surface of a mount comprising the steps of forming a recess in the fixing surface or a lower surface of the optical element to be brought into contact with the fixing surface, placing solid-state cementing material such as solder in the recess, disposing the optical element so that the lower surface thereof is in contact with the fixing surface, and once fusing and then solidifying the cementing material so that the optical element is fixed to the mount by way of the cementing material with the lower surface thereof kept in contact with the fixing surface of the mount.

In accordance with the present invention, there is provided a second optical element fixing method for fixing a collimator lens array to a flat fixing surface of a mount in a laser system comprising one or more laser diodes whose light emitting points are arranged in one direction, the collimator lens array made up of a plurality of collimator lenses each of which collimates a laser beam emitted from one of the leaser diodes and which are integrated into the array in which they are arranged in one direction, a collective lens which collects the laser beams collimated by the collimator lens array, and an optical fiber which is disposed so that the positions of convergence of the laser beams by the collective lens are on the core end face of the optical fiber, and synthesizes the laser beams into a single laser beam, the method comprising the steps of forming a recess in the fixing surface or a lower surface of the collimator lens array to be brought into contact with the fixing surface, placing solid-state cementing material such as solder in the recess, disposing the collimator lens array so that the lower surface thereof is in contact with the fixing surface, and once fusing and then solidifying the cementing material so that the collimator lens array is fixed to the mount by way of the cementing material with the lower surface thereof kept in contact with the fixing surface of the mount.

In accordance with the present invention, there is provided a third optical element fixing method for fixing each of laser diodes to a flat fixing surface of a mount in a laser system comprising one or more of the laser diodes whose light emitting points are arranged in one direction, a collimator lens array made up of a plurality of collimator lenses each of which collimates a laser beam emitted from one of the leaser diodes and which are integrated into the array in which they are arranged in one direction, a collective lens which collects the laser beams collimated by the collimator lens array, and an optical fiber which is disposed so that the positions of convergence of the laser beams by the collective lens are on the core end face of the optical fiber, and synthesizes the laser beams into a single laser beam, the method comprising the steps of forming a recess in the fixing surface or a lower surface of the laser diode to be brought into contact with the fixing surface, placing solid-state cementing material such as solder in the recess, disposing the laser diode so that the lower surface thereof is in contact with the fixing surface, and once fusing and then solidifying the cementing material so that the laser diode is fixed to the mount by way of the cementing material with the lower surface thereof kept in contact with the fixing surface of the mount.

In accordance with the present invention, there is provided a first optical element fixing structure for fixing an optical element to a flat fixing surface of a mount comprising a recess formed in the fixing surface or a lower surface of the optical element to be brought into contact with the fixing surface, and a cementing material such as solder once fused and then solidified in the recess so that the optical element is fixed to the mount by way of the cementing material with the lower surface thereof kept in contact with the fixing surface of the mount.

In accordance with the present invention, there is provided a second optical element fixing structure for fixing a collimator lens array to a flat fixing surface of a mount in a laser system comprising one or more laser diodes whose light emitting points are arranged in one direction, the collimator lens array made up of a plurality of collimator lenses each of which collimates a laser beam emitted from one of the leaser diodes and which are integrated into the array in which they are arranged in one direction, a collective lens which collects the laser beams collimated by the collimator lens array, and an optical fiber which is disposed so that the positions of convergence of the laser beams by the collective lens are on the core end face of the optical fiber, and synthesizes the laser beams into a single laser beam, the structure comprising a recess formed in the fixing surface or a lower surface of the collimator lens array to be brought into contact with the fixing surface, and a cementing material such as solder once fused and then solidified in the recess so that the collimator lens array is fixed to the mount by way of the cementing material with the lower surface thereof kept in contact with the fixing surface of the mount.

In accordance with the present invention, there is provided a third optical element fixing structure for fixing each of laser diodes to a flat fixing surface of a mount in a laser system comprising one or more of the laser diodes whose light emitting points are arranged in one direction, a collimator lens array made up of a plurality of collimator lenses each of which collimates a laser beam emitted from one of the leaser diodes and which are integrated into the array in which they are arranged in one direction, a collective lens which collects the laser beams collimated by the collimator lens array, and an optical fiber which is disposed so that the positions of convergence of the laser beams by the collective lens are on the core end face of the optical fiber, and synthesizes the laser beams into a single laser beam, the structure comprising a recess formed in the fixing surface or a lower surface of the laser diode to be brought into contact with the fixing surface, and a cementing material such as solder once fused and then solidified in the recess so that the laser diode is fixed to the mount by way of the cementing material with the lower surface thereof kept in contact with the fixing surface of the mount.

In the first optical element fixing method, since a recess is formed in the fixing surface or a lower surface of the optical element to be brought into contact with the fixing surface, solid-state cementing material such as solder is placed in the recess, the optical element to be fixed is disposed so that the lower surface thereof is in contact with the fixing surface, and the cementing material is once heat-fused and then solidified so that the optical element is fixed to the mount by way of the cementing material with the lower surface thereof kept in contact with the fixing surface of the mount, the optical element cannot be shifted from the correct position when the solder is solidified, whereby accuracy of positioning the optical element can be high. For example a positioning accuracy of not larger than 0.2 μm can be realized in accordance with the present invention, whereas it has been difficult to secure a positioning accuracy of 0.5 μm in accordance with the prior art.

In the second optical element fixing method, accuracy of positioning the collimator lens array can be high since the collimator lens array is fixed to a flat fixing surface of a mount in a manner basically the same as that in the first optical element fixing method.

In the third optical element fixing method, accuracy of positioning the laser diode can be high since the laser diode is fixed to a flat fixing surface of a mount in a manner basically the same as that in the first optical element fixing method.

Accordingly, in accordance with the second and third optical element fixing methods of the present invention, the accuracy of positioning the laser diode and the collimator lens array with respect to each other can be improved, and the optical axes of the laser beams impinging upon the corresponding collimator lenses are well aligned with the optical axes of the corresponding collimator lenses though the number of the laser beams to be synthesized is increased, whereby a higher intensity synthesized laser beam can be obtained.

The collective lens may be fixed to the mount in a manner similar to fixing the collimator array or the laser diode in the second or third optical element fixing method. In this case, since the accuracy of positioning the collective lens is improved in addition to the accuracy of positioning the laser diode and the collimator lens array, a larger number of laser beams can be collected on the light inlet end face of the optical fiber at a high accuracy.

DESCRIPTION OF THE PREFERRED EMBODIMENTS

Figure 1:
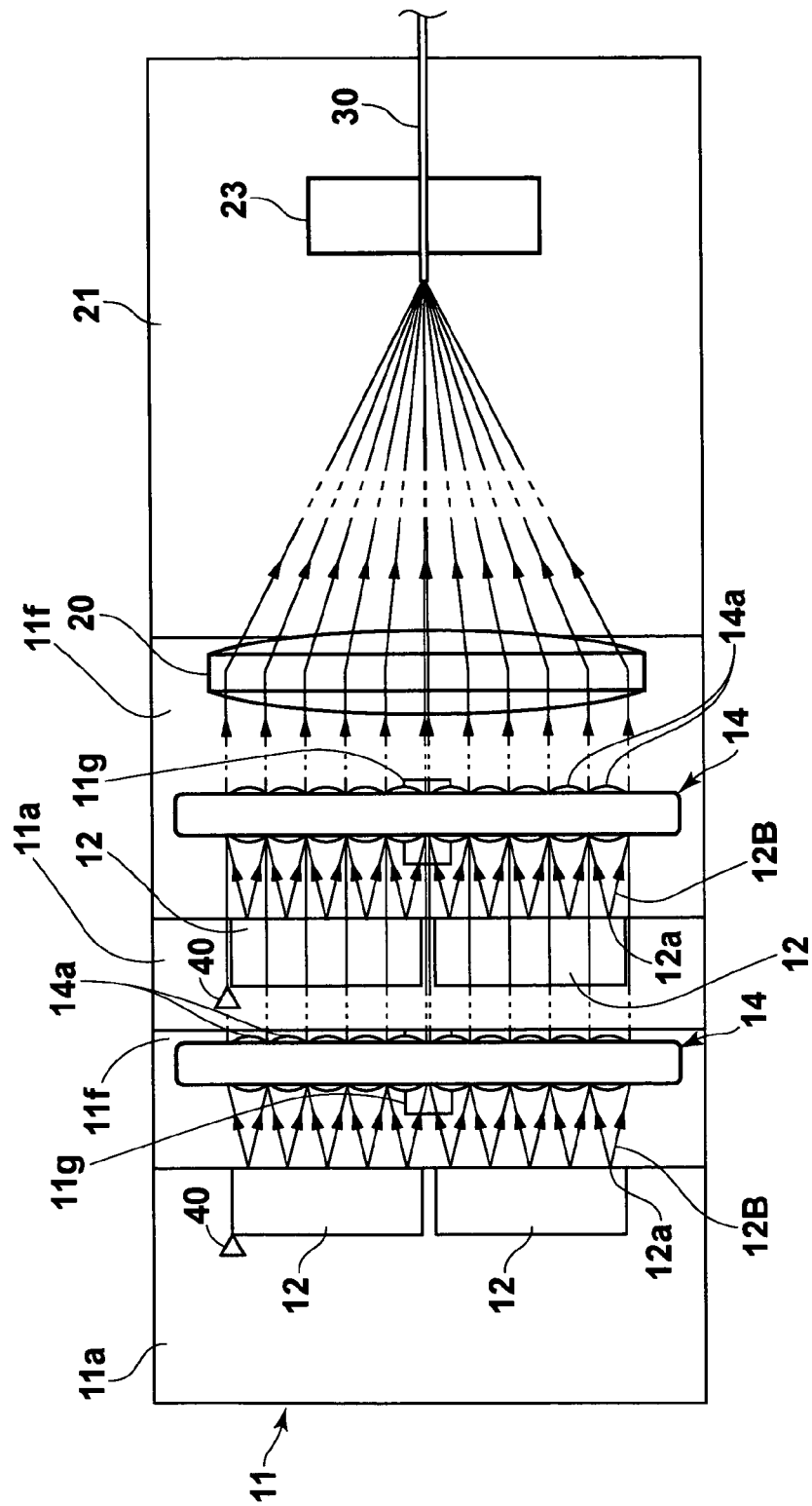
FIG. 1 is a plan view showing a laser beam synthesizing system provided with an optical element fixing structure in accordance with a first embodiment of the present invention.
Figure 2:
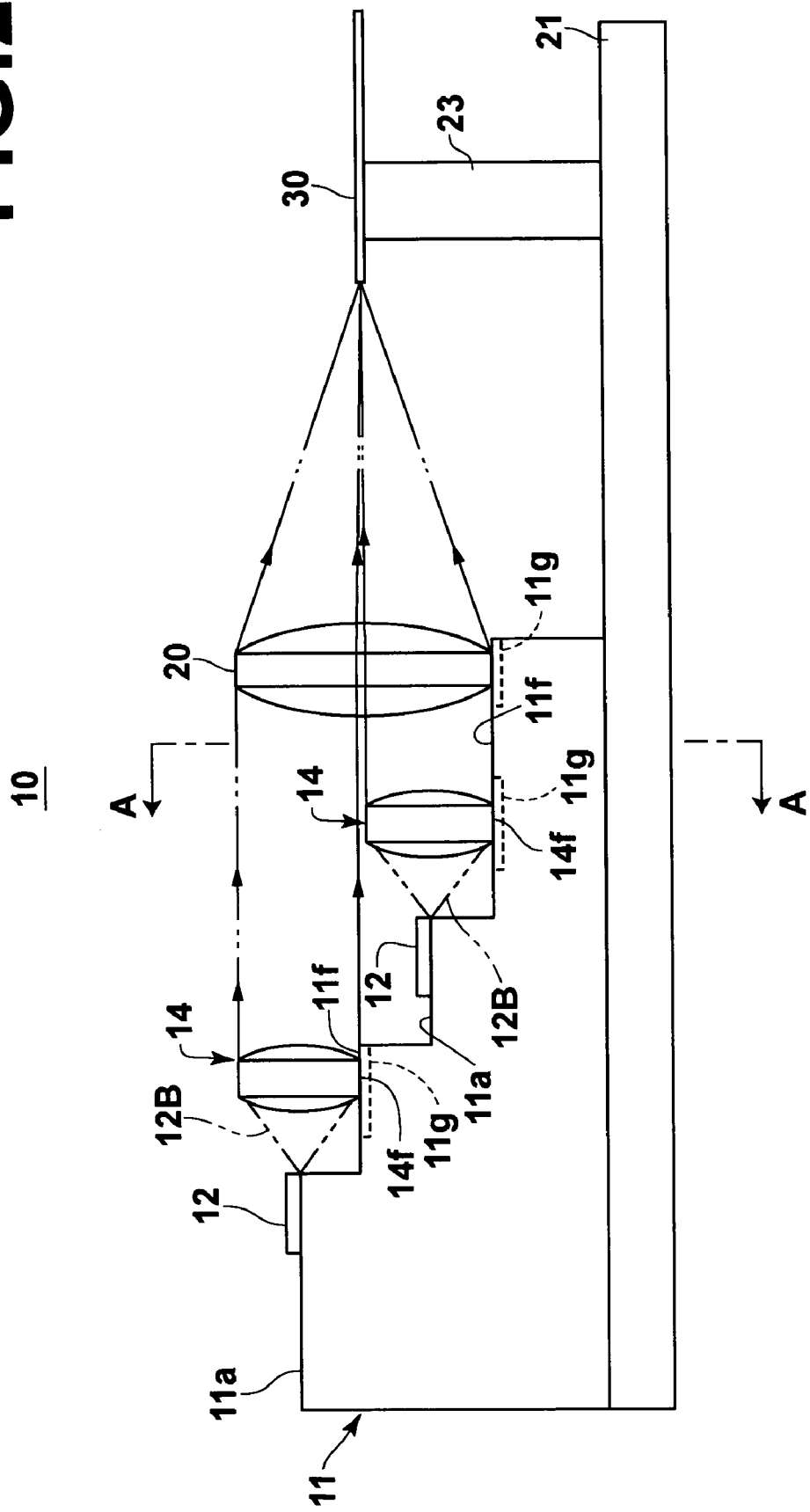
FIG. 2 is a side view showing the laser beam synthesizing system shown in FIG. 1.
Figure 3:
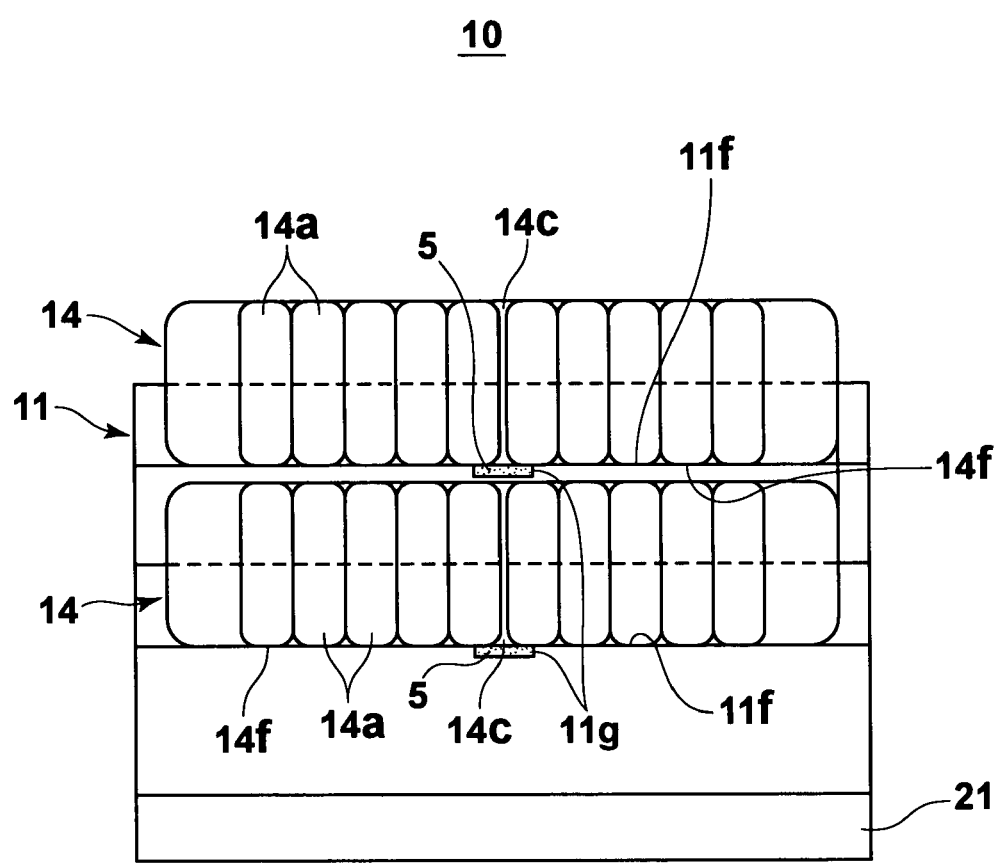
FIG. 3 is a fragmentary front view showing a part of the laser beam synthesizing system shown in FIG. 1.

FIGS. 1 and 2 are plan and side views showing a laser system 10 provided with an optical element fixing structure in accordance with a first embodiment of the present invention, and FIG. 3 is a front view taken along line A—A in FIG. 2. As shown in FIGS. 1 to 3, the laser system 10 comprises two laser diode/collimator lens array combinations, each comprising a pair of multi-cavity laser diode chips 12 and a collimator lens array 14, which are fixed to a heat block (mount) 11 formed of, for instance, Cu, Cu alloy or AlN.

The multi-cavity laser diode chip 12 is, for instance, of a GaN series and oscillates at 405 nm. Further, the multi-cavity laser diode chip 12 has five cavities or five light emitting points 12A. The pair of multi-cavity laser diode chips 12 of each combination are arranged in the same direction as the direction in which the light emitting points 12A are arranged. In this particular embodiment, the five light emitting points 12A of each multi-cavity laser diode chip 12 are formed at 0.35 mm pitch and each light emitting point 12A emits a laser beam 12B at an output of 50 mW.

The heat block 11 comprises tow pairs of a laser fixing surface 11a which is horizontal and on which the multi-cavity laser diode chips 12 are fixed and a lens fixing surface 11f which is horizontal and is formed forward (in which the laser beams are emitted) of the laser fixing surface 11a to be lower than the laser fixing surface 11a by one step. As clearly shown in FIG. 2, the two fixing surfaces 11a and 11f of each pair are different from each other in level and position in the direction of the optical axis, and the pairs are different from each other in level and position in the direction of the optical axis.

A pair of multi-cavity diode chips 12 are fixed on each of the laser fixing surfaces 11a, and one collimator lens array 14 is fixed on each of the lens fixing surfaces 11f.

Each of the laser fixing surfaces 11a is a highly flat surface not larger than 0.5 μm in flatness, and the two laser diode chips 12 are fixed on the laser fixing surface 11a and to each other by solder in order to ensure dissipation of heat, thereby suppressing temperature rise.

The collimator lens array 14 comprises ten collimator lenses 14a which are integrated in a row. In this particular embodiment, each of the collimator lenses 14a is like an elongated part including the optical axis cut from a lens symmetrical about its optical axis, and is 0.9 mm and 1.3 mm in focal length f and effective height. Further, the collimator lens 14a is, for instance, 3:1 in aspect ration in order to conform to the cross-sectional shape of the laser beam 12B. The left-side five collimator lenses 14a and the right-side five collimator lenses 14a are formed at a 0.35 mm pitch (inaccuracy not larger than 0.2 μm), respectively, in order to conform to the pitch of the light emitting points of the left and right multi-cavity laser diode chip 12. A space 14c of 0.05 mm is provided between the left-side five collimator lenses 14a and the right-side five collimator lenses 14a in order to conform to the space between the left and right multi-cavity laser diode chips 12.

Each of the lens fixing surfaces 11f is also a highly flat surface not larger than 0.5 μm in flatness, and the collimator lens array 14 is fixed on the lens fixing surface 11f by solder with its lower surface 14f supported by the lens fixing surface 11f. A collective lens 20 to be described later is also fixed on the lens fixing surface 11f in a similar manner.

As shown in FIGS. 1 and 2, the laser system 10 of this embodiment is for obtaining a high intensity laser beam by synthesizing the plurality of laser beams 12B into a single laser beam. The heat block 11 of the laser system 10 is fixed on a base plate 21, and a fiber holder 23 for holding a light inlet end portion of a multi-mode optical fiber 30 is further fixed on the base plate 21.

The laser beams 12B which are 20 in total number are collimated by the respective collimator lenses 14a of the collimator lens arrays 14, and the 20 collimated laser beams 12B are converged on the light inlet end face of the core of the multi-mode optical fiber 30 by the collective lens 20. The laser beams 12B impinging upon the core of the multi-mode optical fiber 30 propagate along the core and are synthesized into a single laser beam, whereby a single laser beam is radiated from the multi-mode optical fiber 30. As the multi-mode optical fiber 30, step index optical fibers, grated index optical fibers, and composite types of these optical fibers can be employed.

In this particular embodiment, the collective lens 20 is a truncated type lens which is 6 mm in width, 1.8 mm in effective height and 14 mm in focal length, and the multi-mode optical fiber 30 is 50 μm in core diameter and 0.2 in NA (numerical aperture). The 20 laser beams 12B are collected by the collective lens 20 and converged on the end face of the core of the multi-mode optical fiber 30 in a spot diameter of about 40 μm. Loss of the laser beams 12B in coupling to the optical fiber and in transmission through the collimator lens 14a and the collective lens 20 is 10% in total. In this case, when the output power of each laser beam 12B is 50 mW as described above, a high intensity synthesized laser beam of 900 mW can be obtained. When the output power of each laser beam 12B is 100 mW with the same loss, a high intensity synthesized laser beam of 1.8 W can be obtained.

It is necessary to mount the collimator lens arrays 14 on the heat block 11 so that 10 light emitting axes of the multi-cavity leaser diode chips 12 for each of the collimator lens arrays 14 are aligned with the optical axes of the corresponding collimator lenses 14a. Fixing of the collimator lens array 14 will be described in detail, hereinbelow.

Each lens fixing surface 11f of the heat block 11 is provided with a groove (recess) 11g, which is, for instance, 1 mm in width and 50 μm in depth, in a position substantially at the middle of its width (in the direction in which the collimator lenses 14a are arranged in the collimator lens array 14 to be fixed). The inside surface of the groove 11g is plated with Au and the lower surface 14a of the collimator lens array 14 is metallized with Ti/Au/Pt over which Au is subsequently deposited.

When the collimator lens array 14 is to be fixed on the lens fixing surface 11f, solid-state solder is first placed in the groove 11g and then the collimator lens array 14 is held, for instance, by a predetermined jig so that the optical axes of the collimator lenses 14a of the collimator lens array 14 are aligned with the corresponding light emitting axes of the multi-cavity laser diode chips 12 and the back focal points of the collimator lenses 14a are on the corresponding light emitting points 12a of the multi-cavity laser diode chips 12. The lower surface 14f of the collimator lens array 14 is in contact with the lens fixing surface 11f at this time. Then the solder is once heated to be melt in this state and then solidified, whereby the collimator lens array 14 is fixed on the fixing surface by solidified solder 5 (FIG. 3).

When the collimator lens array 14 is fixed on the lens fixing surface 11f in the manner described above, the collimator lens array 14 is held so that its lower surface 14f is in contact with the lens fixing surface 11f by the frictional force throughout. Accordingly, the collimator lens array 14 cannot be moved on the lens fixing surface 11f while the solder is melt and solidified and the positional accuracy of the collimator lens array 14 can be secured high. For example, a positioning accuracy of not larger than 0.2 μm can be secured.

Accordingly the accuracy in positioning the collimator lens array 14 and the multi-cavity laser diode chips 12 is improved, and the optical axes of the laser beams 12B impinging upon the corresponding collimator lenses 14a can be well aligned with the optical axes of the corresponding collimator lenses 14a even if the number of laser beams to be synthesized is increased, whereby a higher intensity synthesized laser beam can be obtained.

In this particular embodiment, a similar groove 11g is formed in the portion of the lower lens fixing surface 11f on which the collective lens 20 is to be fixed as shown in FIG. 2. In the manner similar to that described above, the collective lens 20 is fixed by solder by the use of the groove 11g. By this, the positional accuracy of the collective lens 20 can also be improved, whereby a plurality of laser beams 12B can be collected on the light inlet end face of the multi-mode optical fiber 30 at a high accuracy.

Further, in this particular embodiment, a reference mark 40 which indicates the mounting position of the multi-cavity laser diode chips 12 in the direction in which the light emitting points of the multi-cavity laser diode chips 12 are arranged is formed on each of the laser fixing surfaces 11a of the heat block 11. When the multi-cavity laser diodes 12 are mounted on the heat block 11, the multi-cavity laser diodes 12 can be easily positioned with respect to the heat block 11 in the direction in which the light emitting points of the multi-cavity laser diode chips 12 are arranged by referring to the reference mark 40, whereby assembly of the laser system is simplified and accuracy in positioning the multi-cavity laser diode chips 12 in the horizontal direction can be held high.

Further, in this embodiment, since a plurality of mounting portions are formed on one heat block 11 and a combination of a pair of multi-cavity laser diode chips 12 and a collimator lens array 14 is mounted on each mounting portion, it is not necessary to position a plurality of heat blocks with respect to each other, which is necessary when a plurality of heat blocks are overlaid one on another, and assembly of the laser system 10 is further facilitated.

Though a multi-cavity laser diode chip having 10 light emitting points may be used in place of two multi-cavity laser diode chips having 5 light emitting points, deflection so-called "smile" is more apt to be generated in production of the multi-cavity laser diode chip as the number of the light emitting points increases and the width of the chip increases. In order to prevent generation of such deflection, it is preferred that a plurality of multi-cavity laser diodes having a relatively small number of light emitting points be used.

The number of the light emitting points of each of the multi-cavity laser diode chips and/or the number of the multi-cavity laser diode chips need not be limited to those described above. For example, it is possible to arrange a pair of multi-cavity laser diode chips each having 7 light emitting points and to provide such a pair of multi-cavity laser diode chips on an upper step and a lower step so that a total of 28 laser beams are synthesized into a single laser beam. Further, it is possible to provide three multi-cavity laser diode chips each having 5 light emitting points on three steps which are different in level so that a total of 15 laser beams are synthesized into a single laser beam. In the latter case, when the output power of each laser beam is 50 mW with loss of 10%, a high intensity synthesized laser beam of 675 mW can be obtained.

Further, it is not necessary to provide a plurality of laser diode chips on a plurality of levels but, for instance, a single multi-cavity laser diode chips having 15 light emitting points may be provided on one level so that 15 laser beams emitted from the single multi-cavity laser diode chips are synthesized into a single laser beam. In this case, when the output power of each laser beam is 50 mW with loss of 10%, a high intensity synthesized laser beam of 450 mW can be obtained.

By enclosing the laser system shown in FIG. 1 in an air-tight container, the service life of the laser system can be increased.

Figure 4:
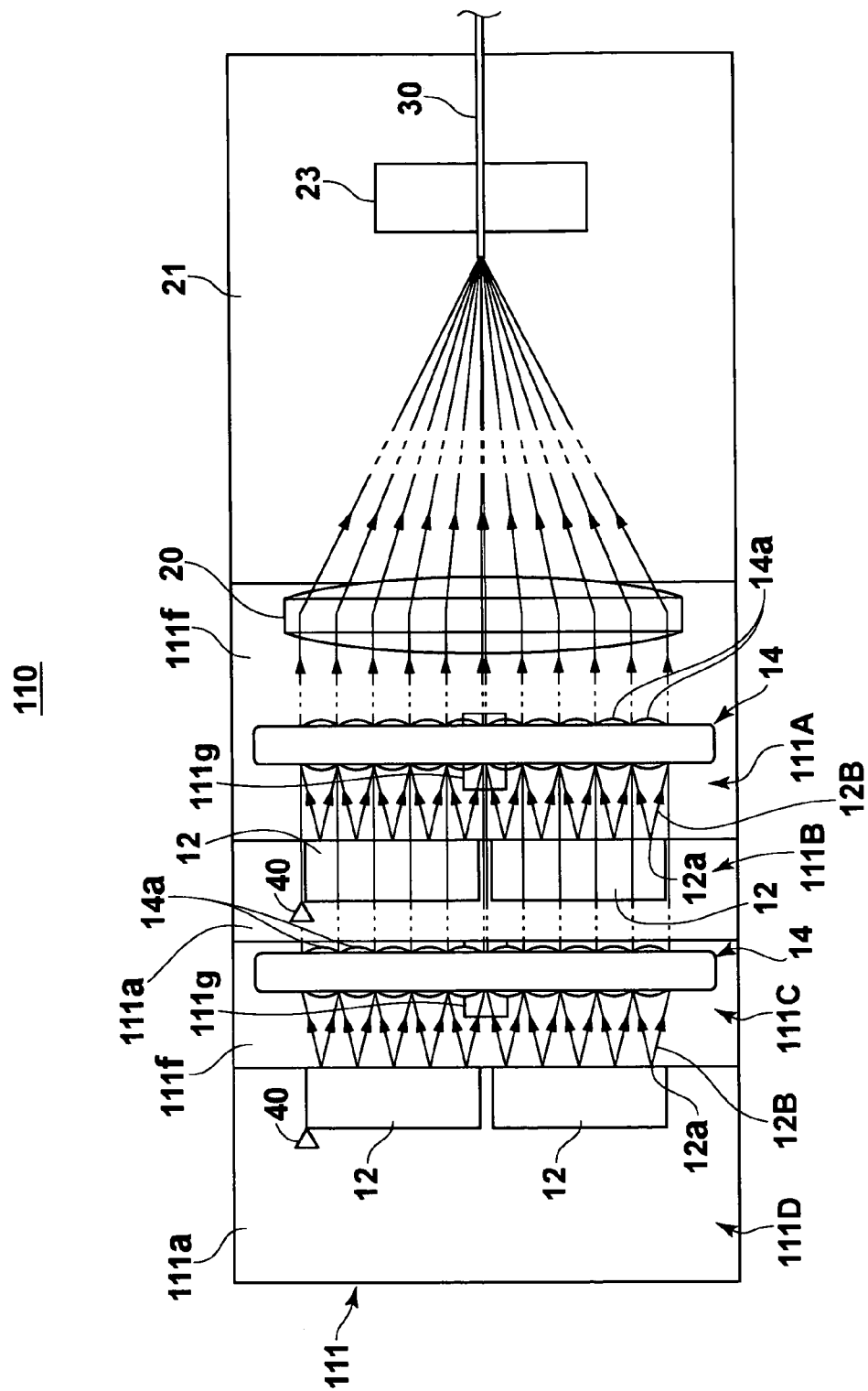
FIG. 4 is a plan view showing a laser beam synthesizing system provided with an optical element fixing structure in accordance with a second embodiment of the present invention.
Figure 5:
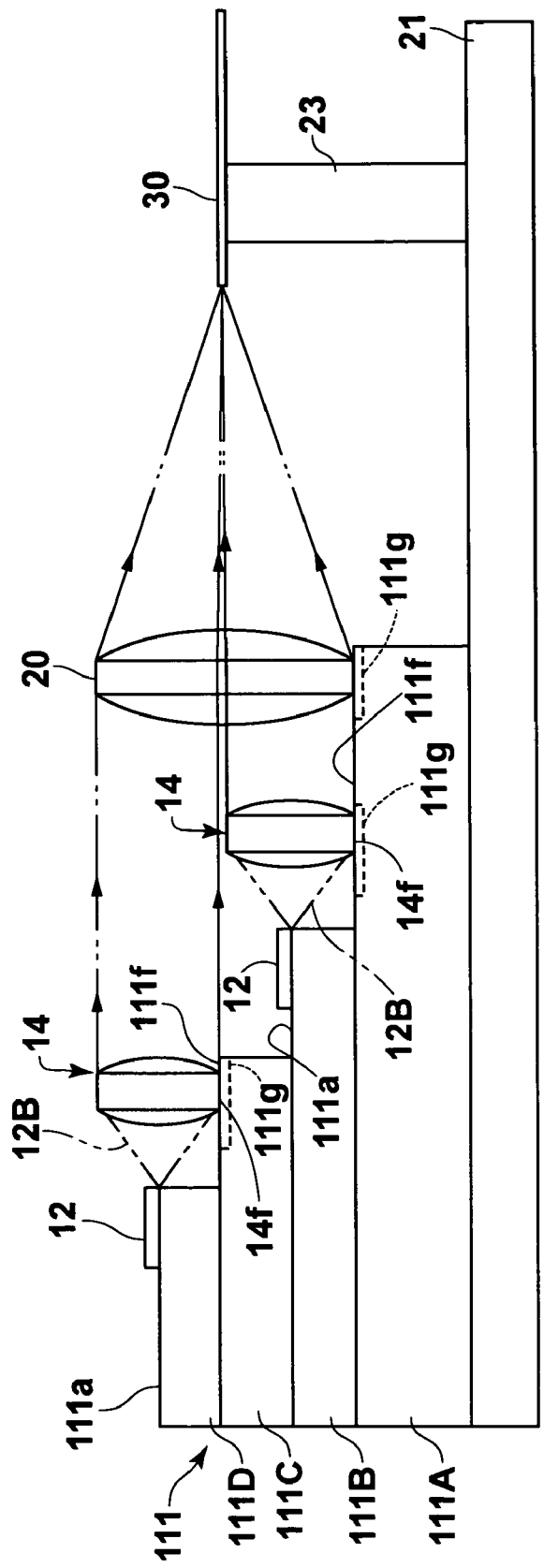
FIG. 5 is a side view showing the laser beam synthesizing system shown in FIG. 4.

A second embodiment of the present invention will be described, hereinbelow. FIGS. 4 and 5 are a plan view and a side view, respectively, showing a laser system 110 provided with an optical element fixing structure in accordance with a second embodiment of the present invention. In FIGS. 4 and 5, the elements analogous to those shown in FIGS. 1 to 3 are given the same reference numerals and will not be described here unless necessary. (the same in the following)

The laser system 110 of this embodiment is basically the same as the laser system 10 shown in FIGS. 1 to 3 except that a plane-plate-laminated type heat block 111 is employed in place of the heat block 11.

The heat block 111 comprises four thin plane plates 111A, 111B, 111C and 111D which are stacked and fixed together in this order from the bottom. The plane plates 111A, 111B, 111C and 111D are formed of, for instance, AlN and metal- lically fixed together. The plane plates 111A, 111B, 111C and 111D may be formed of a material other than AlN, for instance, Cu, Cu alloys or Si. When plane plates of AlN are used, contact surfaces at which adjacent plates are to be in contact with, laser fixing surfaces and lens fixing surfaces are first metallized and then the plates are metallically fixed together. When plane plates comprising Cu are used, contact surfaces at which adjacent plates are to be in contact with are first plated with Au and then the plates are fixed together by solder.

In the heat block 111 in this embodiment, additional plane plate is laminated on the lower plane plate each time the level and the position in the direction of the collimator lens array of the mounting portion differ. That is, the portion of the upper surface of the plane plate 111A extending forward beyond the plane plate 111B forms a lens fixing surface 111f, the portion of the upper surface of the plane plate 111B extending forward beyond the plane plate 111C forms a laser fixing surface 111a, the portion of the upper surface of the plane plate 111C extending forward beyond the plane plate 111D forms another lens fixing surface 111f, and the upper surface of the plane plate 111D forms another laser fixing surface 111a.

Also in this embodiment, a groove 111g similar to the groove 11g in the first embodiment is formed in the lens fixing surface 111f of the plane plate 111c, and the collimator lens array 14 is fixed on the lens fixing surface 111f by solder (not shown) placed in the groove 111g. By employing this fixing structure, an effect similar to that obtained in the first embodiment can be obtained in the second embodiment.

In this particular embodiment, a similar groove 111g is formed in the portion of the lower lens fixing surface 111f on which the collective lens 20 is to be fixed as shown in FIG. 5. In the manner similar to that described above, the collective lens 20 is fixed by solder by the use of the groove 111g. By this, the positional accuracy of the collective lens 20 can also be improved, whereby a plurality of laser beams 12B can be collected on the light inlet end face of the multi-mode optical fiber 30 at a high accuracy.

Though, in the first and second embodiments described above, the recess (the groove 11g or 111g) is formed in the lens fixing surface 11f or 111f, the recess may be formed in the lower surface 14c of the collimator lens array 14 and the solder may be placed in the recess. Otherwise, recesses may be formed in both the lens fixing surface 11f or 111f and the lower surface 14c of the collimator lens array 14 and the solder may be placed in the recesses.

The plane-plate-laminated type heat block 111 comprising a plurality of plane plates 111A to 111D which are stacked and fixed together can be produced at a lower cost as compared with a heat block which is produced by machining a single member. Accordingly, the laser system can be produced at a lower cost by employing such a heat block 111.

Since the plane plates 111A to 111D are generally formed by double-side polishing, a heat block which is high in flatness, parallelism and accuracy in thickness can be obtained at low cost. The plane-plate-laminated type heat block 111 obtained by laminating a plurality of plane plates 111A to 111D is not inferior in the dimensional accuracy to a heat block obtained by cutting. For example, the lens fixing surface and/or the laser fixing surface should be a highly flat surface not larger than 0.5 μm in flatness, the plane-plate-laminated type heat block 111 obtained by laminating a plurality of plane plates meets such a requirement.

Figure 6:
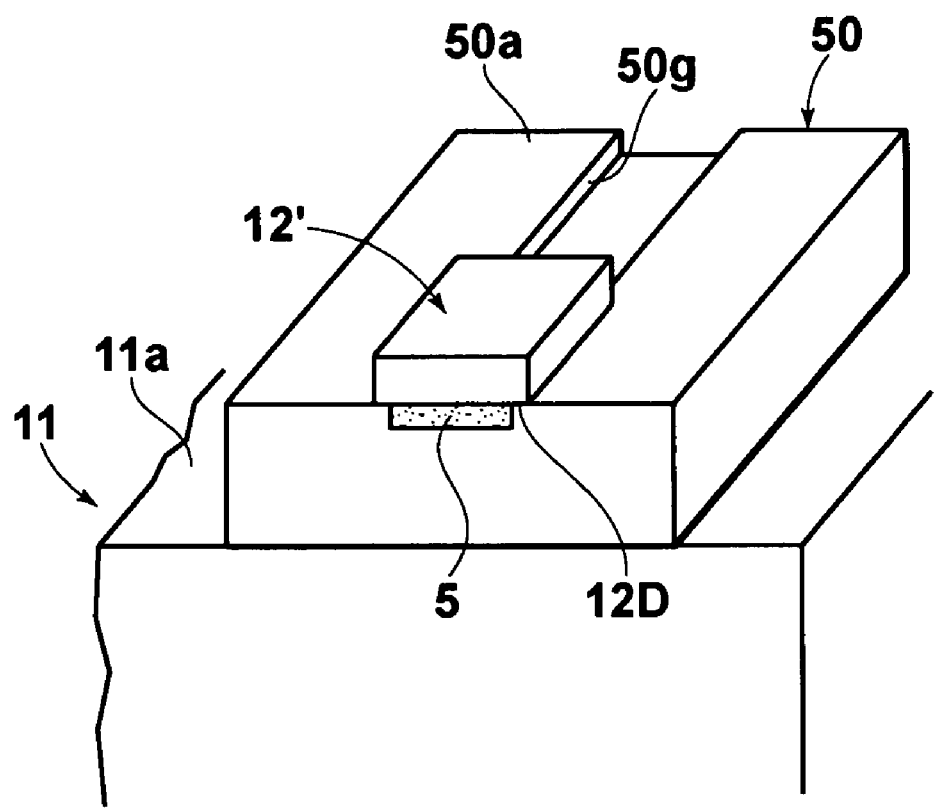
FIG. 6 is a perspective view showing an optical element fixing structure in accordance with a third embodiment of the present invention.

A third embodiment of the present invention will be described, hereinbelow. FIG. 6 shows an optical element fixing structure in accordance with a third embodiment of the present invention. In this embodiment, a single-cavity laser diode chip 12' is fixed on the laser fixing surface 11a of the heat block 11, for instance, shown in FIG. 1. The single-cavity laser diode chip 12' can be used in place of the aforesaid multi-cavity laser diode chip 12 by arranging and fixing a plurality of the single-cavity laser diode chips 12' on the laser fixing surface 11a.

In this particular embodiment, the single-cavity laser diode chip 12' is fixed to a sub-mount 50, for instance, of AlN, and the sub-mount 50 is fixed to the heat block 11 of cu, Cu alloy or the like, whereby the single-cavity laser diode chip 12' is fixed to the heat block 11. The present invention is applied in fixing the single-cavity laser diode chip 12' to the sub-mount 50.

That is, an upward facing, horizontal laser fixing surface 50a is provided with a groove 50g, which is, for instance, 1 mm in width and 50 µm in depth. The inside surface of the groove 11g is plated with Au and the lower surface 12D of the single-cavity laser diode chip 12' is metallized with Ti/Au/Pt over which Au is subsequently deposited.

When the single-cavity laser diode chip 12' is to be fixed on the laser fixing surface 50a, solid-state solder is first placed in the groove 40g and then the single-cavity laser diode chip 12' is held, for instance, by a predetermined jig in a junction-up state (a state where the substrate is positioned below the element forming surface). At this time, the lower surface 12D of the single-cavity laser diode chip 12' is in contact with the laser fixing surface 50a. Then the solder is once heated to be melt in this state and then solidified, whereby the single-cavity laser diode chip 12' is fixed on the fixing surface by solidified solder 5 (FIG. 3).

When the collimator lens array 14 is fixed on the laser fixing surface 50a by the solidified solder 5.

When the single-cavity laser diode chip 12' is thus fixed on the laser fixing surface 50a, the single-cavity laser diode chip 12' is held so that its lower surface 12D is in contact with the laser fixing surface 50a throughout. Accordingly, the single-cavity laser diode chip 12' cannot be moved on the laser fixing surface 50a while the solder is melt and solidified and the positional accuracy of the single-cavity laser diode chip 12' can be secured high. For example, a positioning accuracy of not larger than 0.2 µm can be secured.

When the laser diode is to be fixed to a mount such as a sub-mount or a heat block in a junction-up state as in this embodiment, the recess may be formed in the lower surface of the laser diode and the solder may be placed in the recess. Otherwise, recesses may be formed in both the laser fixing surface and the lower surface of the laser diode and the solder may be placed in the recesses.

Figure 7A:
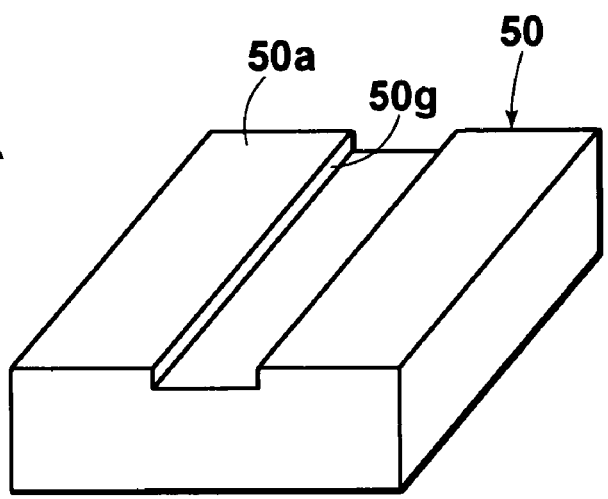
FIGS. 7A to 7C are perspective views showing examples of the shape of the recess to be formed in the fixing surfaces of the mount.
Figure 7B:
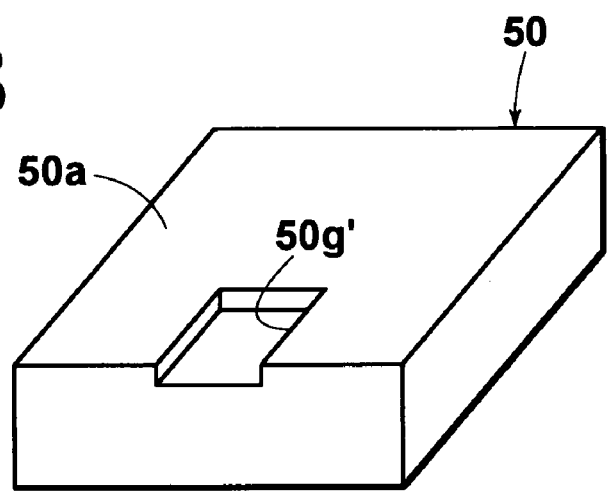
Figure 7C:
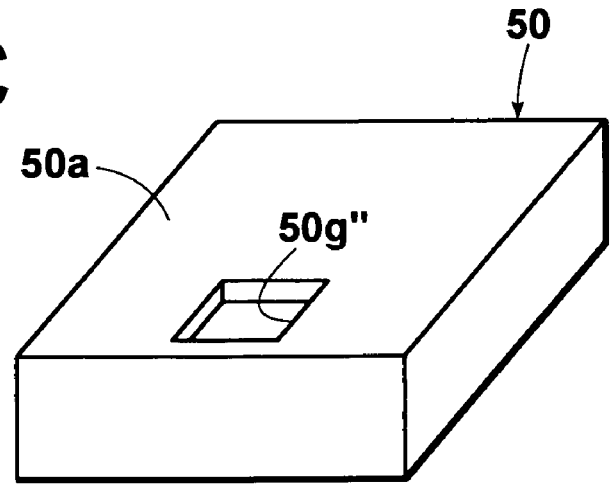

The groove 50g to be formed in the laser fixing surface 50a of the sub-mount 50 may be opened at opposite ends as shown in FIG. 7A. As the groove to be formed in the laser fixing surface 50a of the sub-mount 50, a recess 50g' which is rectangular in shape and closed at one end as shown in FIG. 7B can be employed or a recess 50g" which is rectangular in shape and closed at all the sides as shown in FIG. 7C can be employed.

A fourth embodiment of the present invention will be described, hereinbelow. FIG. 6 is a front view showing an optical element fixing structure in accordance with a fourth embodiment of the present invention. In this embodiment, a GaN series single-cavity laser diode chip 12' is fixed to a Cu heat block 11 as a mount. This structure will be described in detail, hereinbelow.

Figure 9:
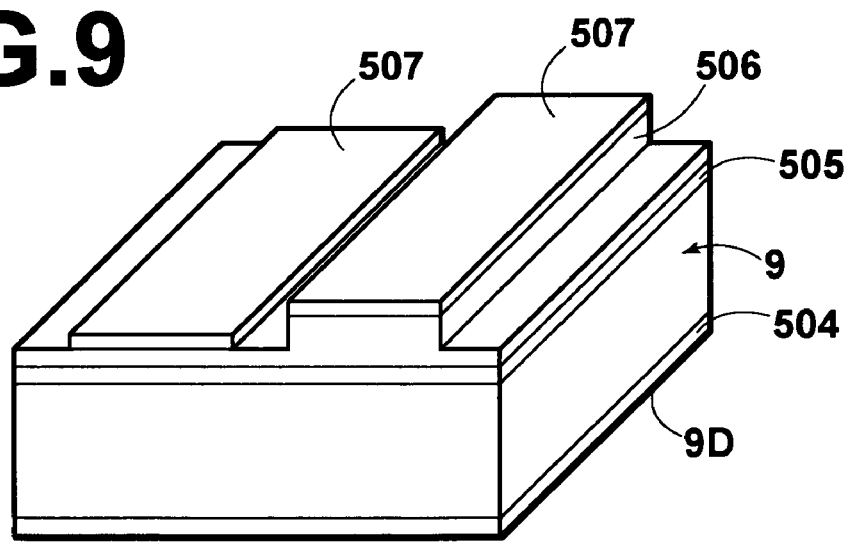
FIG. 9 is a perspective view showing the sub-mount employed in the structure shown in FIG. 8.

An Au/Pt/Ti metallizing layer 504 is first formed on the lower surface of an AlN sub-mount 9 as shown in FIG. 9.

Further, an Au/Ni plating layer 505 and an Au/Pt/Ti metallizing layer 506 having a step are formed on the upper surface of the AlN sub-mount 9 as shown in FIG. 9. The Au/Pt/Ti metallizing layer 506 having a step can be formed by uniformly forming an Au/Pt/Ti metallizing layer in a thickness equal to the thickness of the higher portion and removing the metallizing layer at the portion corresponding to the lower portion by a dry process such as ion milling or a wet process such as etching or by uniformly forming an Au/Pt/Ti metallizing layer in a thickness equal to the thickness of the lower portion and then carrying out metallizing again after the portion corresponding to the lower portion is masked.

Thereafter, AuSn solder pads 507 are respectively placed on the higher portion and the lower portion of the Au/Pt/Ti metallizing layer 506. The AuSn solder pads 507 are formed, for instance, in a size of 150×500 µm and spaced from each other by, for instance, about 10 µm. Then single-cavity laser diode chips 12' which are, for instance, about 400×600×100 µm in size are placed on the AuSn solder pads 507 and the AuSn solder pads 507 are heated to 330° C. to be melt, whereby the single-cavity laser diode chips 12' are fixed to the AlN sub-mount 9.

A groove (recess) 11m is formed in the laser fixing surface 11a of the heat block 11. An Au/Ni plating layer 508 and an Au/Pt/Ti metallizing layer 509 are formed on the bottom surface of the groove 11m in this order. Then solid state AuSn solder 511 is placed in the groove 11m and the AlN sub-mount 9 is placed over the solder 511 with the Au/Pt/Ti metallizing layer 504 faced downward. Thereafter, the AuSn solder 511 is heated to 310° C. to be melt, whereby the AlN sub-mount 9 is fixed on the laser fixing surface 11a of the heat block 11 by the solder 511. In this manner, the single-cavity laser diode chip 12' is fixed to the heat block 11 by way of the AlN sub-mount 9.

When the AlN sub-mount 9 is thus fixed to the heat block 11, the AlN sub-mount 9 is held so that its lower surface 9D (the surface of the Au/Pt/Ti metallizing layer 504) is in contact with the laser fixing surface 11a throughout. Accordingly, the AlN sub-mount 9 cannot be moved on the laser fixing surface 11a while the solder is melt and solidified and the positional accuracy of the single-cavity laser diode chip 12' can be secured high. For example, a positioning accuracy of not larger than 0.2 µm can be secured.

The melting point of AuSn solder changes with the ratio of Au and Sn. Accordingly, the AuSn solder 507 and the AuSn solder 511 can be different from each other in melting point after once melt by controlling the thickness of the Au/Pt/Ti metallizing layer 504 and that of the Au/Pt/Ti metallizing layer 506 of the AlN sub-mount 9 independently of each other and at the same time controlling the melting temperatures of the AuSn solder 507 and the AuSn solder 511 so that the ratio of Au is higher than the eutectic composition by several percent after AuSn solders 507 and 511 are melt.

By making such a melting temperature difference, the AlN sub-mount 9 can be bonded to the heat block 11 by melting the AuSn solder at a temperature different from that at which the AuSn solder is melt to bond the single-cavity laser diode chip 12' to the AlN sub-mount 9 (lower in the former bonding). This makes it unnecessary to use a low-melting solder which is apt to fluctuate the position of the light emitting point with time, which is advantageous in suppressing fluctuation in the position of the light emitting point.

In this embodiment, the single-cavity laser diode chip 121 is mounted in so-called a junction-down state where the substrate of $Al_2O_3$ is positioned above and the element forming surface side (the pn junction side) is fixed to the heat block 11.

Figure 8:
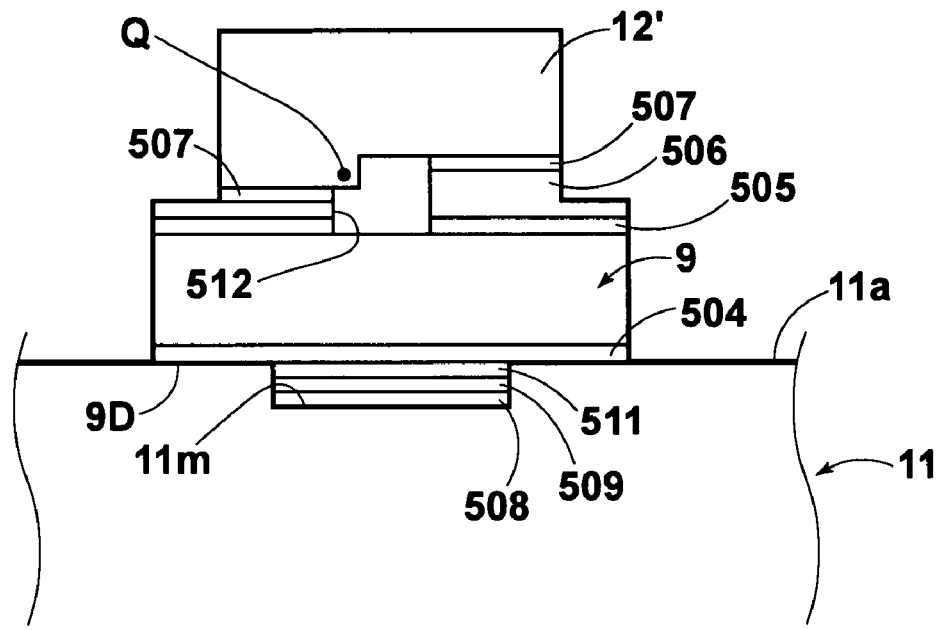
FIG. 8 is a front view showing an optical element fixing structure in accordance with a fourth embodiment of the present invention.

Further, in this structure, the light emitting point of the single-cavity laser diode chip 12' is substantially in the position indicated at Q in FIG. 8. The AuSn solder 507, the Au/Pt/Ti metallizing layer 506 and the Au/Ni plating layer 505 are divided by a groove 512 and the single-cavity laser diode chip 12' is bonded to the sub-mount 9 so that the groove 512 is positioned just below its light emitting portion. That is, since the light emitting portion of the single-cavity laser diode chip 12' is not directly bonded to the sub-mount 9, the stress on the light emitting portion is reduced. Further, by virtue of the groove 512, the emitted laser beam cannot be eclipsed by the AlN sub-mount 9 even if the light emitting end face of the single-cavity laser diode chip 12' is positioned inside the end face of the AlN sub-mount 9.

It is possible to form the n-side electrode of the single-cavity laser diode chip 12' in a position opposed to the higher portion of the Au/Pt/Ti metallizing layer 506 with the higher portion and the lower portion of the Au/Pt/Ti metallizing layer 506 electrically insulated from each other and to electrically connect the higher and lower portion of the Au/Pt/Ti metallizing layer 506 respectively to the n-side electrode and the p-side electrode of the single-cavity laser diode chip 12'.

Further, in this particular embodiment, since the single-cavity laser diode chip 12' is fixed to the AlN sub-mount in a junction down structure, the light emitting portion of the single-cavity laser diode chip 12' can be closer to the heat block 11 as compared with when the substrate side is fixed to the AlN sub-mount 9, whereby heat is dissipated more effectively.

Further, since the AuSn eutectic solder 507 is especially excellent in properties of fluctuation in the position of the light emitting point with time, fluctuation in the position of the light emitting point with time of the single-cavity laser diode chip 12' can be effectively prevented by bonding the single-cavity laser diode chip 12' to the AlN sub-mount 9 by way of the AuSn eutectic solder 507.

Figure 10:
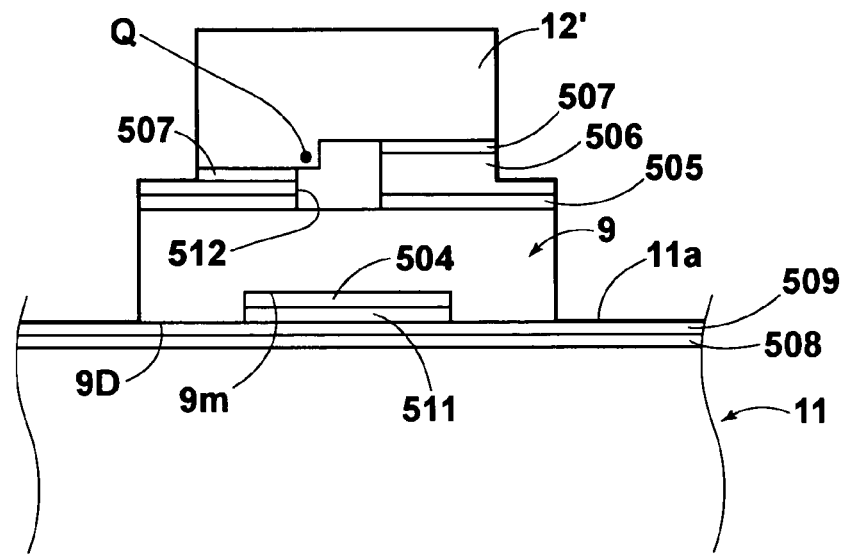
FIG. 10 is a front view showing an optical element fixing structure in accordance with a fifth embodiment of the present invention.

A fifth embodiment of the present invention will be described, hereinbelow. FIG. 10 is a front view showing an optical element fixing structure in accordance with a fifth embodiment of the present invention. In this embodiment, a single-cavity laser diode chip 12' is fixed to a Cu heat block 11 as a mount. This structure will be described in detail, hereinbelow.

Figure 11:
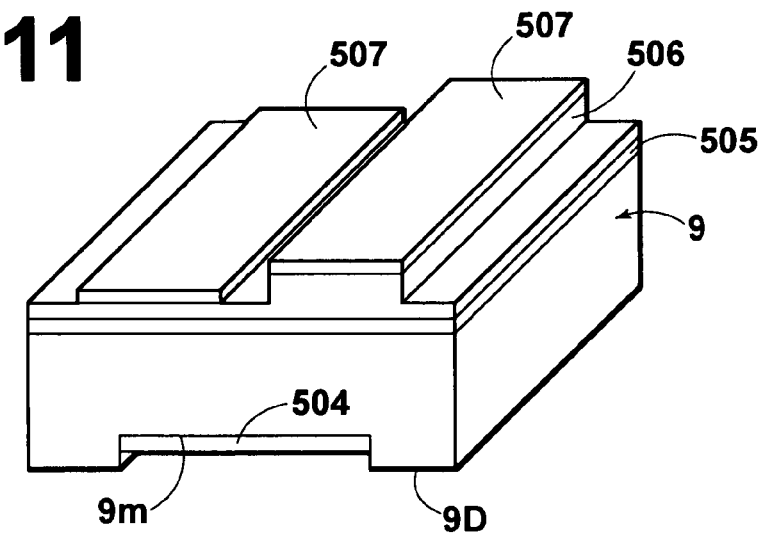
FIG. 11 is a perspective view showing the sub-mount employed in the structure shown in FIG. 10.

A groove (recess) 9m is formed on the lower surface 9D of an AlN sub-mount 9 and an Au/Pt/Ti metallizing layer 504 is formed on the bottom surface of the groove 9m as shown in. FIG. 11. Further, an Au/Ni plating layer 505 and an Au/Pt/Ti metallizing layer 506 having a step similar to that in the fourth embodiment are formed on the upper surface of the AlN sub-mount 9.

Thereafter, AuSn solder pads 507 are respectively placed on the higher portion and the lower portion of the Au/Pt/Ti metallizing layer 506. Then single-cavity laser diode chips 12' are placed on the AuSn solder pads 507 and the AuSn solder pads 507 are heated to 330° C. to be melt, whereby the single-cavity laser diode chips 12' are fixed to the AlN sub-mount 9.

An Au/Ni plating layer 508 and an Au/Pt/Ti metallizing layer 509 are formed on the upper surface of the heat block 11 in this order. Then solid state AuSn solder 511 is placed in the groove 9m and the AlN sub-mount 9 is placed over the heat block 11 with the lower surface 9D faced downward.

Thereafter, the AuSn solder 511 is heated to 310° C. to be melt, whereby the AlN sub-mount 9 is fixed on the laser fixing surface 11a of the heat block 11 by the solder 511. In this manner, the single-cavity laser diode chip 12' is fixed to the heat block 11 by way of the AlN sub-mount 9.

When the AlN sub-mount 9 is thus fixed to the heat block 11, the AlN sub-mount 9 is held so that its lower surface 9D is in contact with the laser fixing surface 11a throughout. Accordingly, the AlN sub-mount 9 cannot be moved on the laser fixing surface 11a while the solder is melt and solidified and the positional accuracy of the single-cavity laser diode chip 12' can be secured high.

Though, in the embodiments described above, the present invention is applied to fixing a collimator lens array, a laser diode or a sub-mount with a laser diode fixed thereto to a mount, the present invention can be applied to fixing other optical elements to a mount with similar effect.

The cementing material to be employed need not be limited to solder but may be other known brazing materials as desired.

What is claimed is:

1. An optical element fixing method for fixing an optical element to a flat fixing surface of a mount comprising the steps of
    forming a recess in the fixing surface or a lower surface of the optical element to be brought into contact with the fixing surface,
    placing solid-state cementing material in the recess, disposing the optical element so that the lower surface thereof is in contact with the fixing surface, and
    once fusing and then solidifying the cementing material so that the optical element is fixed to the mount by way of the cementing material with the lower surface thereof kept in contact with the fixing surface of the mount;
    wherein the fixing surface and the lower surface of the optical element are substantially planar such that static friction causes the optical element to maintain its position on the fixing surface during the fusing and solidifying steps.

2. A method as defined in claim 1 in which the cementing material is solder.

3. An optical element fixing method for fixing a collimator lens array to a flat fixing surface of a mount in a laser system comprising
    one or more laser diodes whose light emitting points are arranged in one direction,
    the collimator lens array made up of a plurality of collimator lenses each of which collimates a laser beam emitted from one of the leaser diodes and which are integrated into the array in which they are arranged in one direction,
    a collective lens which collects the laser beams collimated by the collimator lens array, and
    an optical fiber which is disposed so that the positions of convergence of the laser beams by the collective lens are on the core end face of the optical fiber, and synthesizes the laser beams into a single laser beam,
    the method comprising the steps of
        forming a recess in the fixing surface or a lower surface of the collimator lens array to be brought into contact with the fixing surface,
        placing solid-state cementing material in the recess,
        disposing the collimator lens array so that the lower surface thereof is in contact with the fixing surface, and once fusing and then solidifying the cementing material so that the collimator lens array is fixed to the mount by way of the cementing material with the lower surface thereof kept in contact with the fixing surface of the mount;

wherein the fixing surface and the lower surface of collimator lens array are substantially planar such that static friction causes the collimator lens array to maintain its position on the fixing surface during the fusing and solidifying steps.

4. A method as defined in claim 3 in which the cementing material is solder.

5. An optical element fixing method for fixing each of laser diodes to a flat fixing surface of a mount in a laser system comprising one or more of the laser diodes whose light emitting points are arranged in one direction, a collimator lens array made up of a plurality of collimator lenses each of which collimates a laser beam emitted from one of the leaser diodes and which are integrated into the array in which they are arranged in one direction, a collective lens which collects the laser beams collimated by the collimator lens array, and an optical fiber which is disposed so that the positions of convergence of the laser beams by the collective lens are on the core end face of the optical fiber, laser beams into a single laser beam, the method comprising the steps of forming a recess in the fixing surface or a lower surface of the laser diode to be brought into contact with the fixing surface, placing solid-state cementing material in the recess, disposing the laser diode so that the lower surface thereof is in contact with the fixing surface, and once fusing and then solidifying the cementing material so that the laser diode is fixed to the mount by way of the cementing material with the lower surface thereof kept in contact with the fixing surface of the mount;

wherein the fixing surface and the lower surface of the laser diode are substantially planar such that static friction causes the laser diode to maintain its position on the fixing surface during the fusing and solidifying steps.

6. A method as defined in claim 5 in which the cementing material is solder.

7. An optical element fixing structure for fixing an optical element to a flat fixing surface of a mount comprising a recess formed in the fixing surface or a lower surface of the optical element to be brought into contact with the fixing surface, and a cementing material once fused and then solidified in and synthesizes the recess so that the optical element is fixed to the mount by way of the cementing material with the lower surface thereof kept in contact with the fixing surface of the mount;

wherein the fixing surface and the lower surface of the optical element are substantially planar such that static friction causes the optical element to maintain its position on the fixing surface when the optical element is fixed to the mount.

8. A structure as defined in claim 7 in which the cementing material is solder.

9. An optical element fixing structure for fixing a collimator lens array to a flat fixing surface of a mount in a laser system comprising one or more laser diodes whose light emitting points are arranged in one direction, the collimator lens array made up of a plurality of collimator lenses each of which collimates a laser beam emitted from one of the teaser diodes and which are integrated into the array in which they are arranged in one direction, a collective lens which collects the laser beams collimated by the collimator lens array, and an optical fiber which is disposed so that the positions of convergence of the laser beams by the collective lens are on the core end face of the optical fiber, and synthesizes the laser beams into a single laser beam, the structure comprising a recess formed in the fixing surface or a lower surface of the collimator lens array to be brought into contact with the fixing surface, and a cementing material once fused and then solidified in the recess so that the collimator lens array is fixed to the mount by way of the cementing material with the lower surface thereof kept in contact with the fixing surface of the mount;

wherein the fixing surface and the lower surface of the collimator lens array are substantially planar such that static friction causes the collimator lens array to maintain its position on the fixing surface when the optical element is fixed to the mount.

10. A structure as defined in claim 9 in which the cementing material is solder.

11. An optical element fixing structure for fixing each of laser diodes to a flat fixing surface of a mount in a laser system comprising one or more of the laser diodes whose light emitting points are arranged in one direction, a collimator lens array made up of a plurality of collimator lenses each of which collimates a laser beam emitted from one of the leaser diodes and which are integrated into the array in which they are arranged in one direction, a collective lens which collects the laser beams collimated by the collimator lens array, and an optical fiber which is disposed so that the positions of convergence of the laser beams by the collective lens are on the core end face of the optical fiber, and synthesizes the laser beams into a single laser beam, the structure comprising a recess formed in the fixing surface or a lower surface of the laser diode to be brought into contact with the fixing surface, and a cementing material once fused and then solidified in the recess so that the laser diode is fixed to the mount by way of the cementing material with the lower surface thereof kept in contact with the fixing surface of the mount.

12. A structure as defined in claim 11 in which the cementing material is solder.

* * * * *